(12) United States Patent
Komatsu

(10) Patent No.: US 8,314,657 B2
(45) Date of Patent: Nov. 20, 2012

(54) D-CLASS AMPLIFIER

(75) Inventor: Terumitsu Komatsu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/169,558

(22) Filed: Jun. 27, 2011

(65) Prior Publication Data

US 2011/0316626 A1    Dec. 29, 2011

(30) Foreign Application Priority Data

Jun. 29, 2010  (JP) ................................ 2010-148132

(51) Int. Cl.
*H03F 21/00*  (2006.01)
(52) U.S. Cl. .................................... 330/207 A; 330/251
(58) Field of Classification Search .............. 330/207 A, 330/251, 10, 297, 285, 296
See application file for complete search history.

(56) References Cited

U.S. PATENT DOCUMENTS

| 7,696,818 B2 * | 4/2010 | Kunihiro et al. ................ 330/10 |
| 7,825,725 B2 | 11/2010 | Komatsu |
| 7,889,109 B2 * | 2/2011 | Murahashi ..................... 341/143 |
| 2008/0258831 A1 * | 10/2008 | Kunihiro et al. .............. 332/103 |
| 2010/0315275 A1 * | 12/2010 | Murahashi ..................... 341/143 |

FOREIGN PATENT DOCUMENTS

| JP | 2004-88431 A | 3/2004 |
| JP | 2009-27540 A | 2/2009 |

* cited by examiner

*Primary Examiner* — Henry Choe
(74) *Attorney, Agent, or Firm* — Foley & Lardner LLP

(57) ABSTRACT

A D-class amplifier includes: a bridge circuit adapted to drive an inductive load; a power supply voltage detection section outputting a quantized power supply voltage signal indicating a power supply voltage fed to the bridge circuit; and a gain-controlled PWM section adjusting a gain in response to the quantized power supply voltage signal, amplifying the input signal in response to the gain, generating a PWM signal from the amplified input signal, and feeding the PWM signal to the bridge circuit. The power supply voltage detection section includes: an error integration section generating a quantized signal by integrating a difference between the power supply voltage and the quantized power supply voltage signal; and a digital filter removing high frequency components of the quantized signal to output the quantized power supply voltage signal. The gain-controlled PWM section controls the gain such that variations of the power supply voltage are cancelled.

14 Claims, 25 Drawing Sheets

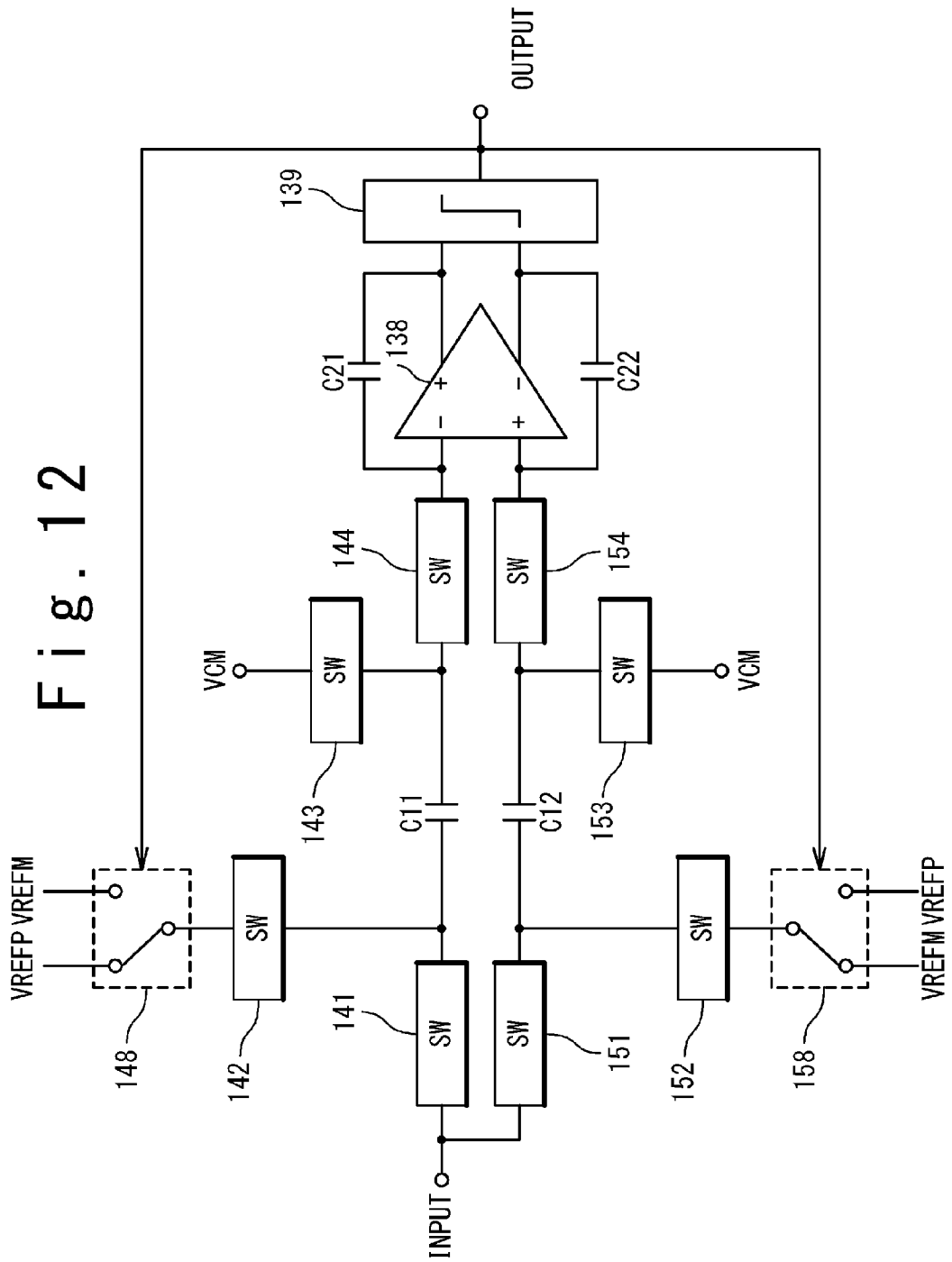

SPECTRUM OF INTEGRATED ERROR INPUT SIGNAL
(CHARACTERISTICS OF FIRST ORDER LPF)

SPECTRUM OF INTEGRATED ERROR OUTPUT SIGNAL

OUTPUT OF DIGITAL FILTER OF TRANSFER FUNCTION H(z)

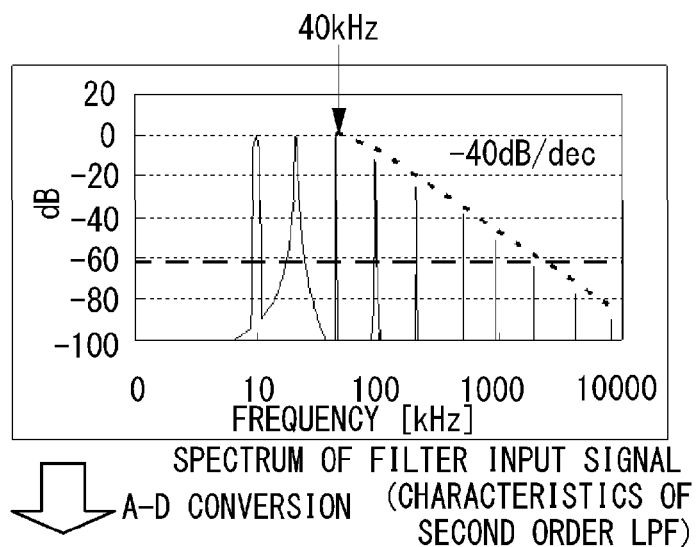
SPECTRUM OF FILTER INPUT SIGNAL
(CHARACTERISTICS OF SECOND ORDER LPF)
A-D CONVERSION
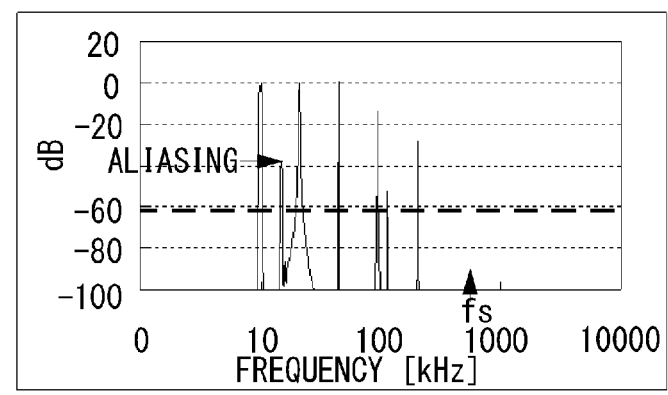
SPECTRUM OF SIGNAL OBTAINED BY
SAMPLING AT fs = 512 kHz

SPECTRUM OF FILTER INPUT SIGNAL
(CHARACTERISTICS OF FIRST ORDER LPF)

SPECTRUM OF SIGNAL OBTAINED BY
SAMPLING AT fs = 8.2 MHz

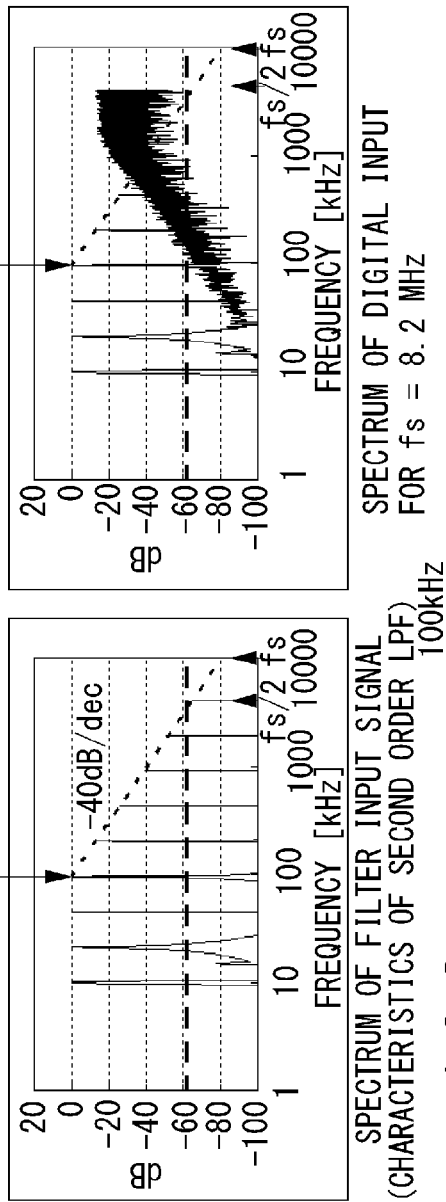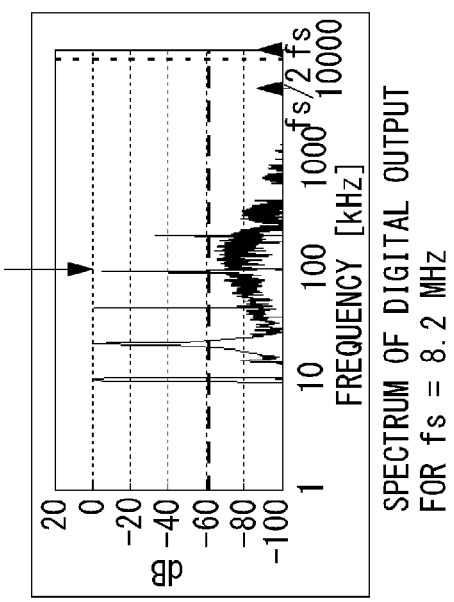

D-CLASS AMPLIFIER

CROSS-REFERENCE TO RELATED APPLICATION

This application claims the benefit of priority based on Japanese Patent Application No. 2010-148132, filed on Jun. 29, 2010, the disclosure of which is incorporated herein by reference.

BACKGROUND

The present invention relates to a D-class amplifier in an integrated circuit, more particularly to a PWM (pulse width modulation)-based D-class amplifier suitable for an inductive load, such as a coil.

D-class amplifiers, which achieve power amplification through pulse width modulation on an input signal, are used for various applications, such as audio amplifiers and motor control drivers, in which further power consumption reduction is desired compared to linear amplifiers. An exemplary D-class amplifier is disclosed in Japanese Patent Application Publication No. 2009-027540 A and the corresponding U.S. patent application Ser. No. 12/219,349 (published as U.S. Patent Application Publication No. 2009/0021305 A), the disclosures of which are incorporated herein by reference.

In the following, a description is given of an issue found by the inventor, with reference to the attached drawings.

In general, a D-class amplifier includes a triangular wave generator 54, a comparator 56 and a bridge circuit 24 as shown in FIG. 1. The comparator 56 compares the input voltage with the level of the triangular wave signal outputted from the triangular wave generator 54 and outputs a pulse wave signal with a duty ratio of [input voltage]/[triangular wave amplitude]. The D-class amplifier achieves power amplification of the input signal by feeding the pulse wave signal to the bridge circuit 24, which incorporates low output impedance switch elements, to switch the power supply voltage. Although the output voltage of a D-class amplifier originally has a pulse waveform, the current is smoothed when the load is inductive. The D-class amplifier can reduce the self power consumption compared to linear amplifiers, since the circuit stage which drives the load performs a switching operation with a low impedance. As shown in FIG. 2, however, such circuit configuration leads to variations in the amplitude of the output pulse voltage when the power supply voltage of the bridge circuit varies. In order to address this, an approach is sometimes used in which the output pulse voltage is fed back through an LPF (low pass filter), as shown in FIG. 3 In the configuration shown in FIG. 3, the LPF includes a resistor R, a capacitor C and an amplifier 58. This configuration provides feed-back of the voltage including information of the power supply voltage, and thereby effectively reduces the error caused by variations in the power supply voltage of the D-class amplifier. The approach in which the output voltage is fed back, however, is not suitable for circuit integration, since a high-order filter circuit is needed for smoothing the output pulse signal. When the PWM frequency is 500 kHz, the amplitude of the triangular wave signal is Vp-p, the power supply voltage of the D-class amplifier is 5 V, and the signal frequency band of the D-class amplifier is 20 kHz, for example, then the voltage obtained by filtering the output pulse signal may exhibit a large error, unless the signal obtained by filtering the output pulse signal has a sufficiently small amplitude compared to the triangular wave amplitude of Vp-p as shown in FIG. 4. In order to achieve an attenuation down to 1% of Vp-p, an attenuation of 54 dB (=1/5/100) is required at the frequency of 500 kHz. On the other hand, the attenuation should be reduced as much as possible in a band lower than 20 kHz, which is the signal band. Accordingly, the filter of the output pulse needs to be structured as an LPF of an order of three or higher, as shown in FIG. 5. This undesirably results in an increase in the circuit size in the actual integration.

As disclosed in Japanese Patent Application Publication No. 2004-088431 A, the output error caused by variations in the power supply voltage of a D-class amplifier can be reduced by feeding back the power supply voltage. This approach, in which the power supply voltage is measured by an A-D converter and fed back, requires high specifications for the A-D converter, including performances of a sampling speed of 300k samples per second and 10-bit resolution (for an error of 0.1%). This undesirably leads to an increase in the circuit size, even when a successive approximation type A-D converter, which has a relatively small size, is used. In the above-mentioned patent document, an approach is proposed for reducing the requirements of the A-D converter. In this approach, as shown in FIG. 6, an A-D converter circuitry includes a HPF (high pass filter) 70, a high-speed A-D converter 71, an LPF (low pass filter) 72, a low-speed A-D converter 73 and an adder 74. The HPF 70 and the high-speed A-D converter 71 are connected in series and the LPF 72 and the low speed A-D converter 73 are also connected in series. The adder 74 adds the outputs of the high-speed and low-speed A-D converters 71 and 73. This configuration, however, requires two filters and two A-D converters, resulting in an increase in the circuit size. In addition, A-D converters usually require anti-aliasing filters on the input and output, although this is not explicitly described in the above-mentioned patent document. When there is no anti-aliasing filter and noise of a frequency higher than a half of the sampling frequency (fs) is superposed on the power supply voltage, this causes aliasing and generates noise of low frequency components, as shown in FIGS. 7A and 7B. FIG. 7A shows the spectrum of an input signal having a uniform distribution in a band between fs/2 and fs and FIG. 7B shows the spectrum of a signal obtained by sampling the input signal at the sampling frequency of fs. Under such situations, the noise and signal components cannot be distinguished and the noise components cannot be removed by providing any sort of filter to the output.

SUMMARY

In an aspect of the present invention, a D-class amplifier includes: a bridge circuit adapted to drive an inductive load; a power supply voltage detection section outputting a quantized power supply voltage signal indicating a power supply voltage fed to the bridge circuit; and a gain-controlled PWM section adjusting a gain in response to the quantized power supply voltage signal, amplifying the input signal in response to the gain, generating a PWM signal from the amplified input signal, and feeding the PWM signal to the bridge circuit. The power supply voltage detection section includes: an error integration section generating a quantized signal by integrating a difference between the power supply voltage and the quantized power supply voltage signal; and a digital filter removing high frequency components of the quantized signal to output the quantized power supply voltage signal. The gain-controlled PWM section controls the gain such that variations of the power supply voltage are cancelled.

The present invention provides a D-class amplifier which reduces the error resulting from variations in the power supply voltage with a reduced circuit size.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 12 is a block diagram showing an exemplary configuration of a switched-capacitor integration circuit incorporated within the error integration section of the D-class amplifier according to the second embodiment;

FIG. 16A is a graph showing the spectrum of the input signal of the A-D converter of FIG. 6 for a case when the anti-aliasing filter connected to the input of the A-D converter has second order LPF characteristics;

FIG. 16B is a graph showing the spectrum of a signal obtained by sampling the output signal of the A-D converter at a sampling frequency of fs=512 kHz;

FIG. 19A is a graph showing the spectrum of the input signal of the error integration section for the case when the anti-aliasing filter connected to the input of the error integration section has second order LPF characteristics;

FIG. 19B is a graph showing the spectrum of a signal obtained by sampling the output signal of the error integration section at a sampling frequency of fs=8.2 MHz;

FIG. 19C is a graph showing the spectrum of the output signal of a digital filter for the case when the sampling frequency fs is 8.2 MHz;

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
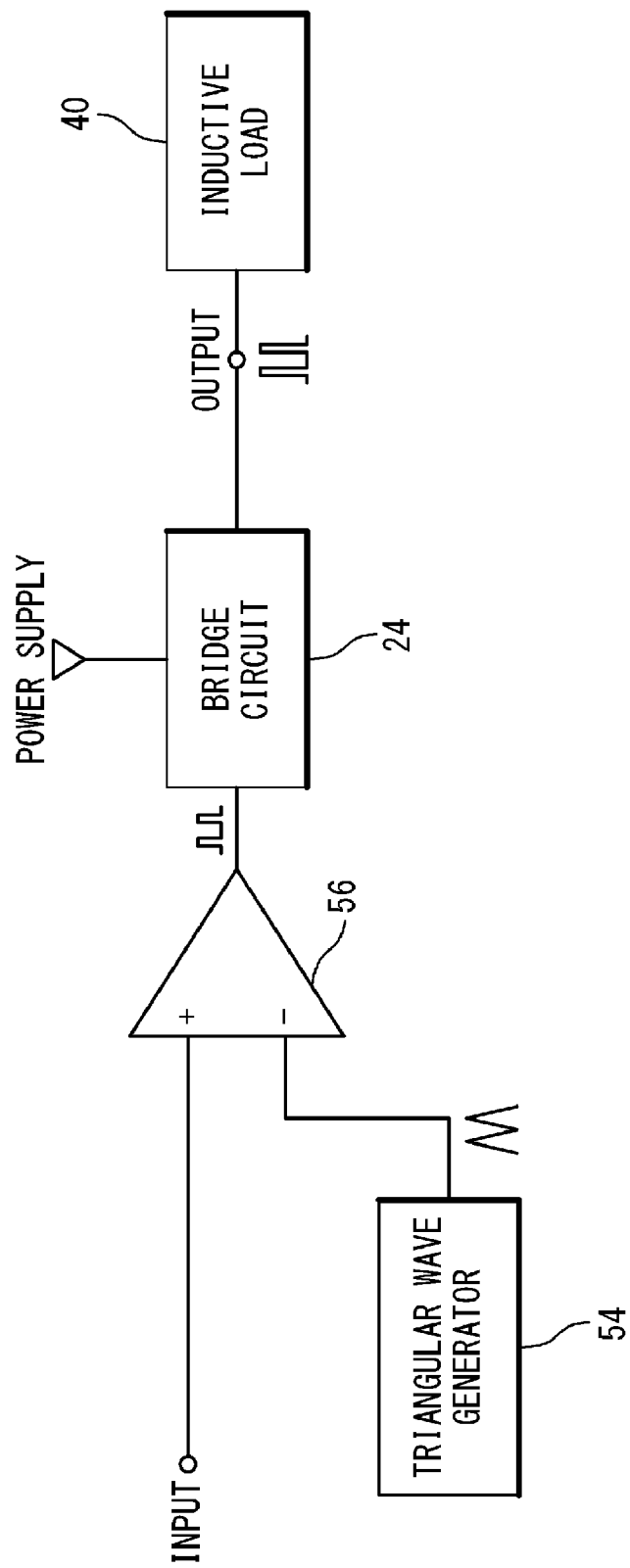
FIG. 1 is a block diagram showing an exemplary configuration of a commonly-used D-class amplifier.
Figure 2:
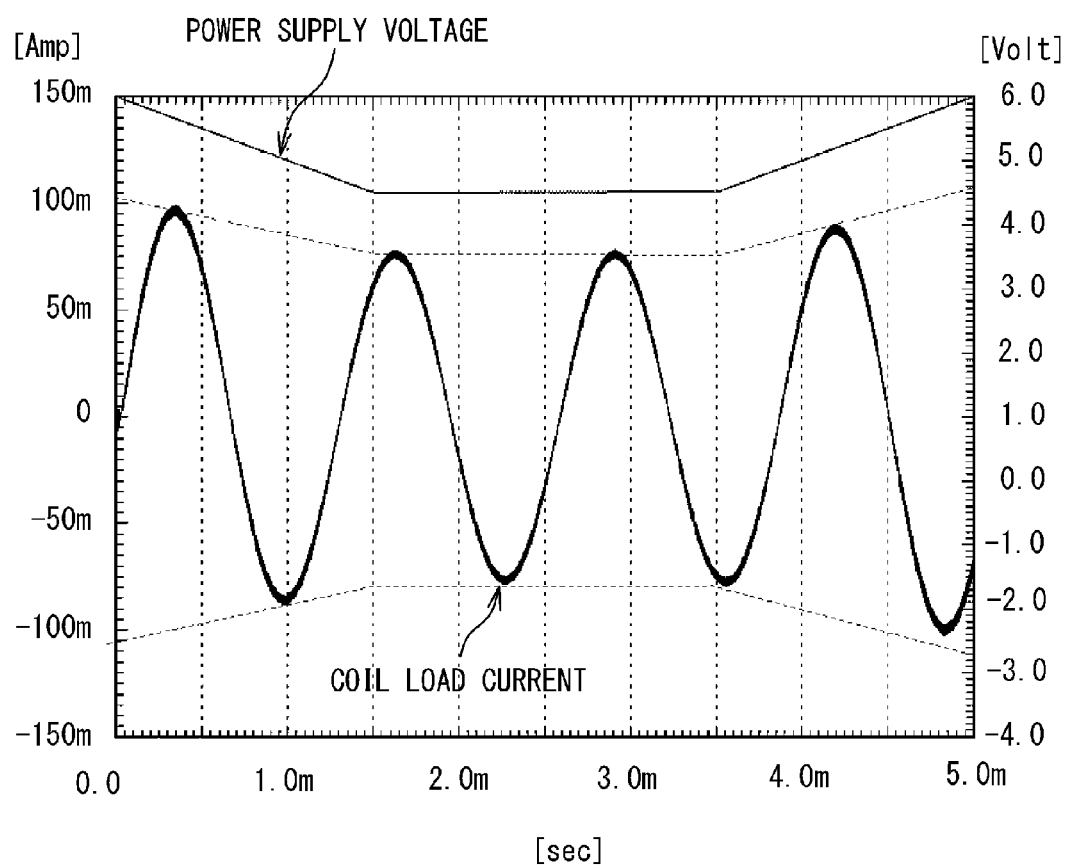
FIG. 2 is a graph showing influences of variations in the power supply voltage on the load.
Figure 3:
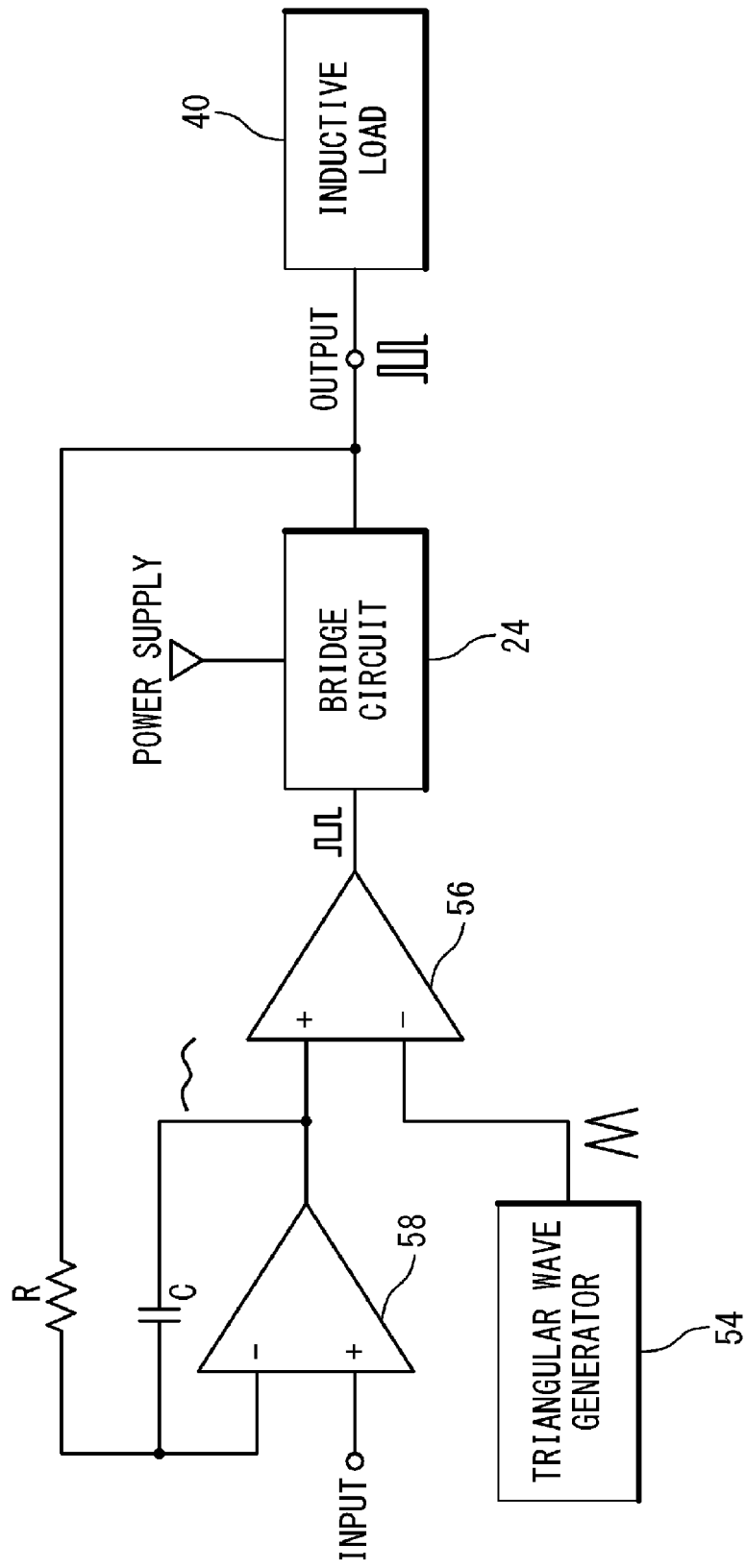
FIG. 3 is a block diagram showing an exemplary configuration of a D-class amplifier adapted to feedback control.
Figure 4:
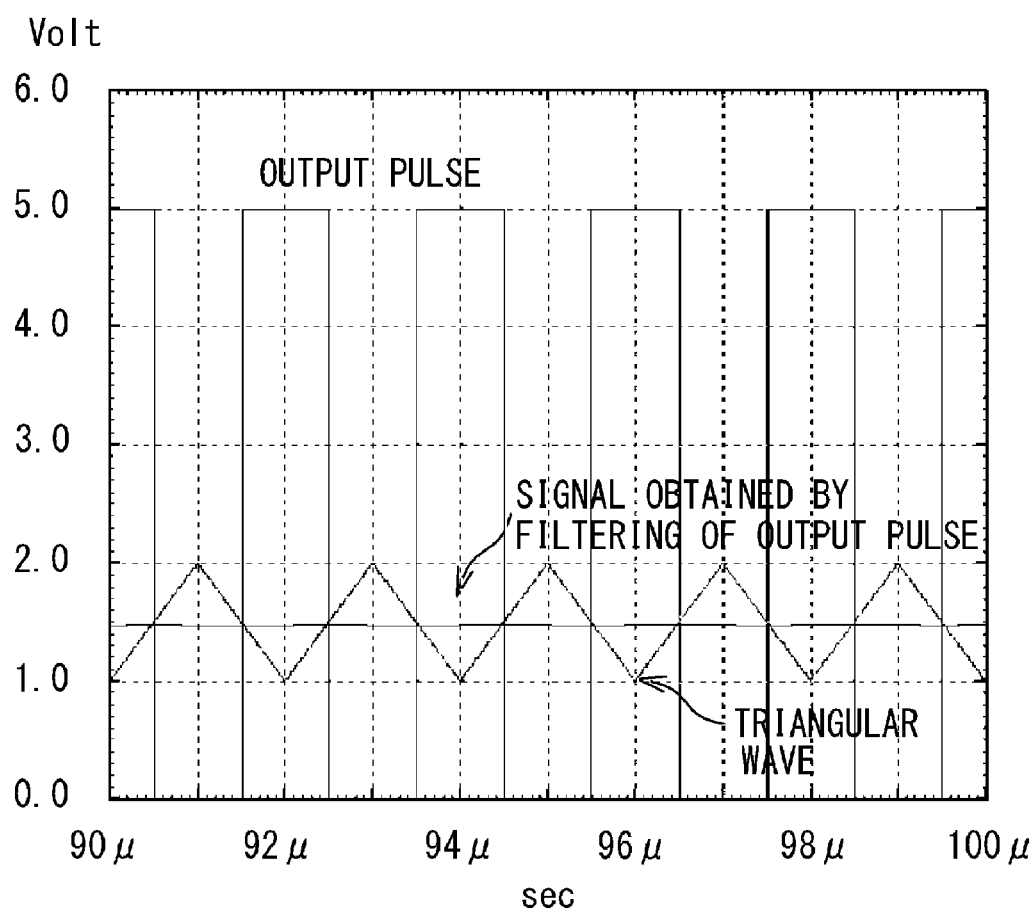
FIG. 4 is a diagram showing waveforms of an output pulse, a smoothed signal and a triangular wave signal.
Figure 5:
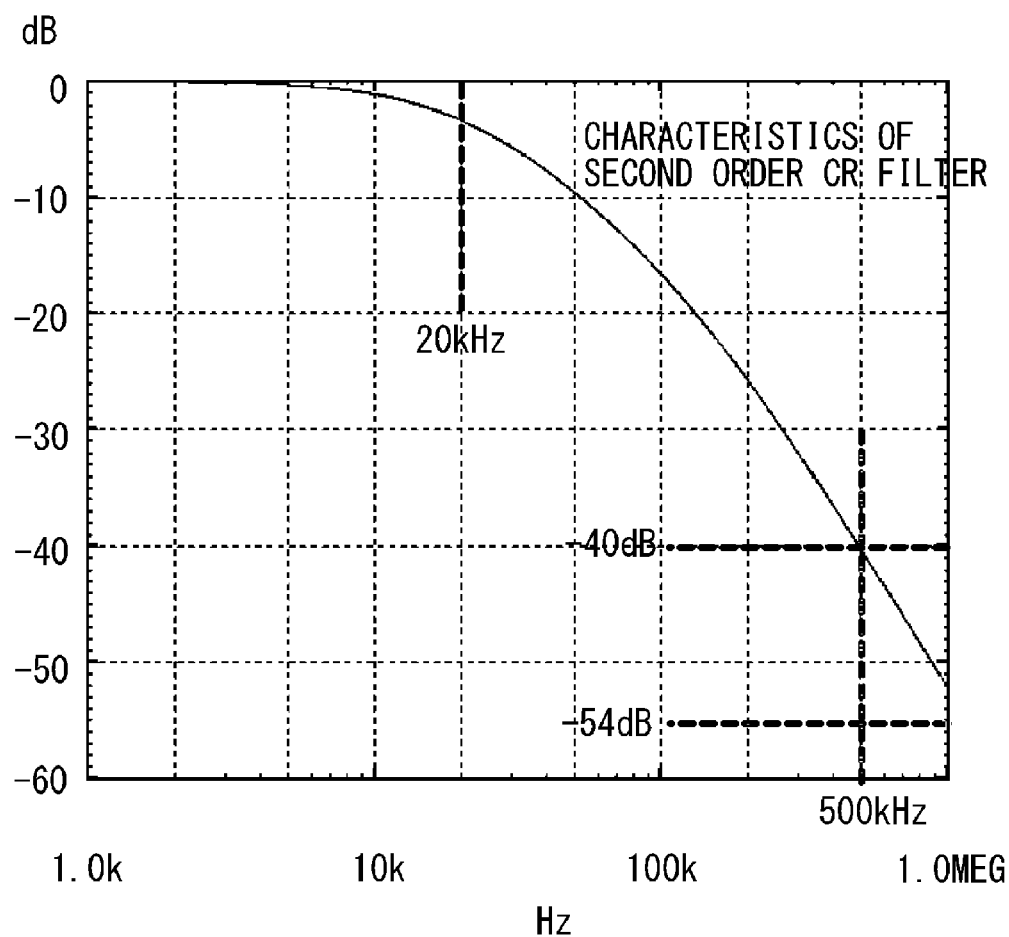
FIG. 5 is a graph showing frequency characteristics of a second order RC filter.
Figure 6:
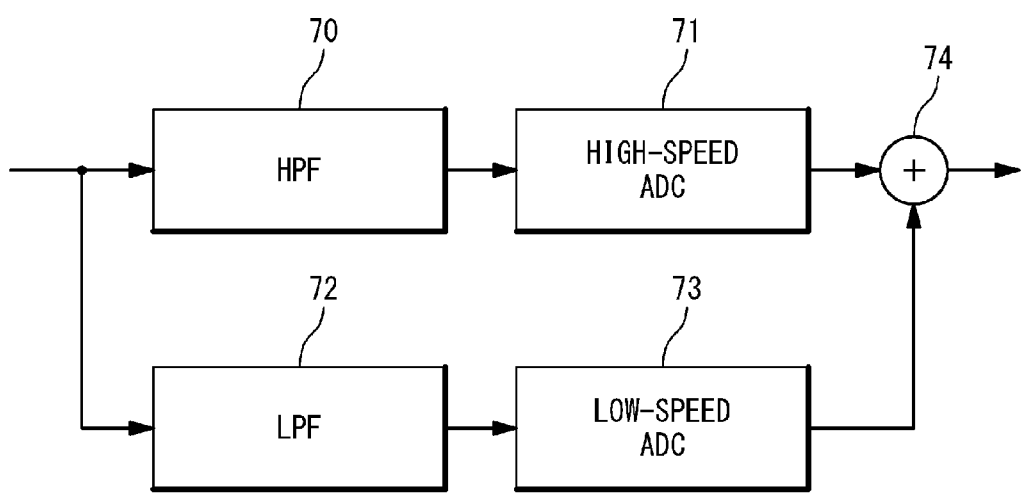
FIG. 6 is a diagram showing an exemplary configuration of A-D converter means.
Figure 7A:
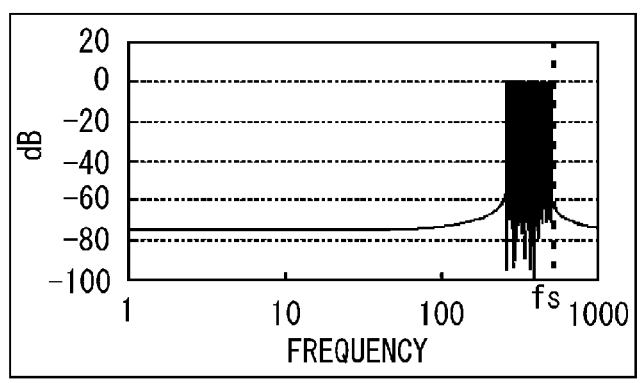
FIGS. 7A and 7B are diagrams showing generation of aliasing.
Figure 7B:
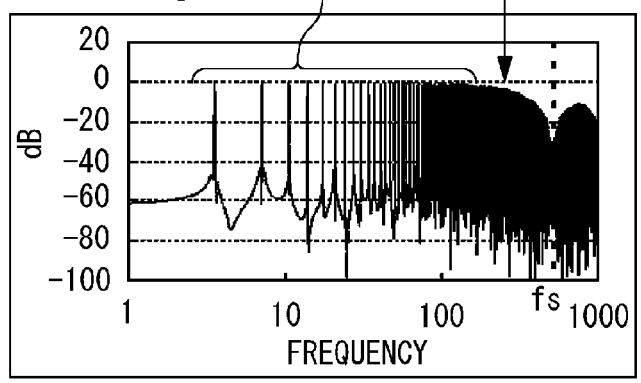
Figure 8:
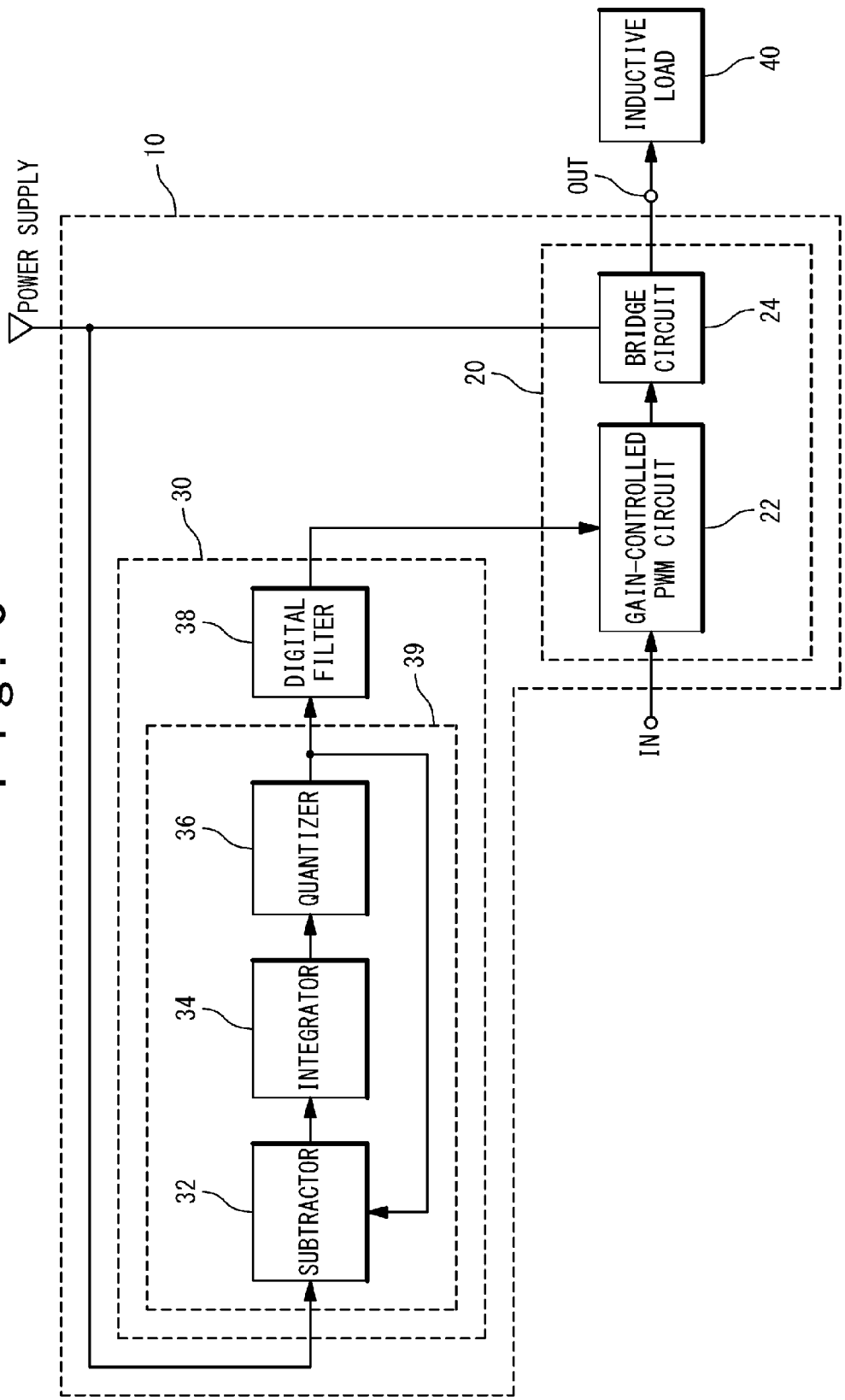
FIG. 8 is a diagram showing an exemplary configuration of a D-class amplifier according to a first embodiment of the present invention.

FIG. 8 is a block diagram showing an exemplary configuration of a D-class amplifier 10 according to a first embodiment of the present invention. The D-class amplifier 10 includes a power supply voltage detection section 30 and an amplifier section 20. The power supply voltage detection section 30 detects variations in the power supply voltage fed to the amplifier section 20. The amplifier section 20 amplifies an input signal in response to the voltage variations detected by the power supply voltage detection section 30 to thereby drive an inductive load 40.

The power supply voltage detection section 30 includes an error integration section 39 and a digital filter 38. The error integration section 39 includes a subtractor 32, an integrator 34 and a quantizer 36. The amplifier section 20 includes a gain-controlled PWM circuit 22 and a bridge circuit 24. The power supply detection section 30 is fed with the power supply voltage which is fed to the bridge circuit 24. The subtractor 32 outputs the difference (error) between the received power supply voltage and the output of the quantizer 36 to the integrator 34. The integrator 34 outputs the integration of the difference to the quantizer 36. The quantizer 36 quantizes the integration result and outputs the quantized integration result to the digital filter 38. The digital filter 38 filters out high frequency noise components from the quantized integration result to generate a quantized power supply voltage $PWR_{SENSE}$, and feeds the quantized power supply voltage $PWR_{SENSE}$ to the gain-controlled PWM circuit 22.

The gain-controlled PWM circuit 22 outputs a PWM signal to the bridge circuit 24 obtained by amplifying the input signal and performing PWM modulation on the amplified input signal, while controlling the gain thereof in response to the quantized power supply voltage $PWR_{SENSE}$. The bridge circuit 24 includes a half bridge circuit or an H-bridge circuit and performs power amplification on the inputted PWM signal to obtain an output signal.

Figure 9:
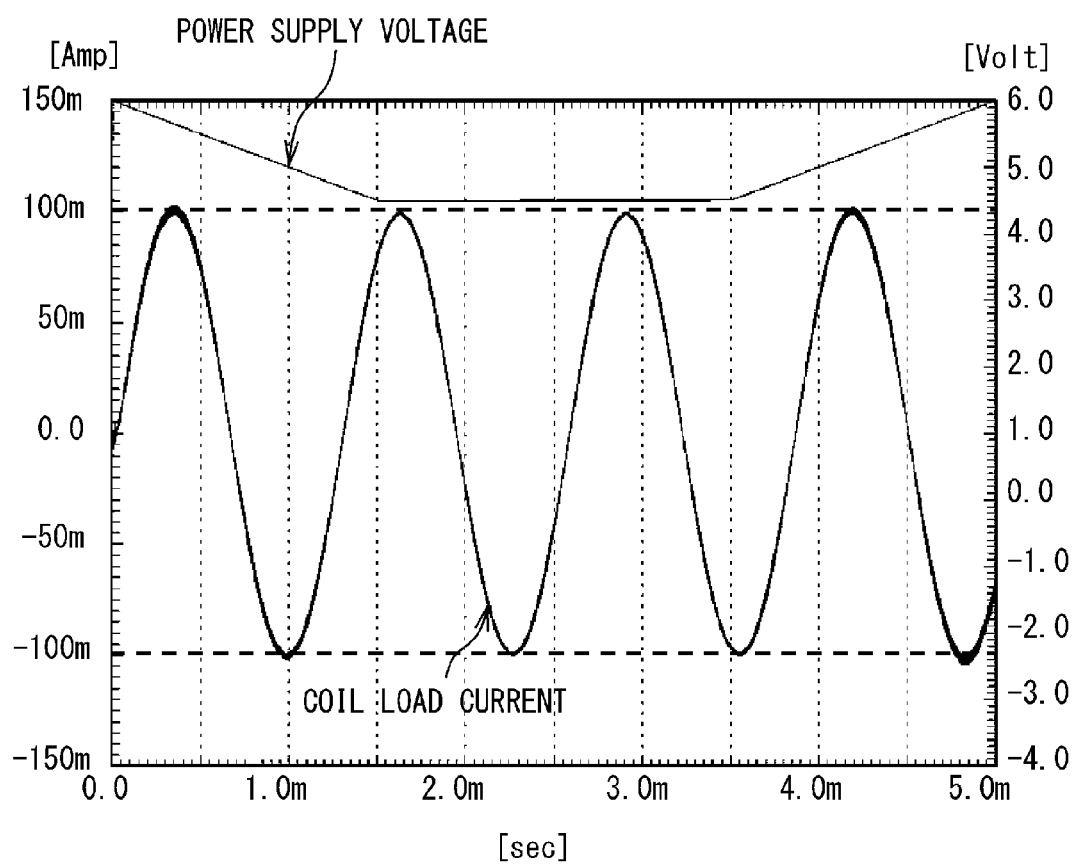
FIG. 9 is a diagram showing an effect of reduction of an output error caused by variations in the power supply voltage.

Such configuration effectively reduces the output error resulting from variations in the power supply voltage by feeding back the power supply voltage of the D-class amplifier, as shown in FIG. 9. In this configuration, the difference between the power supply voltage of the D-class amplifier 10 and the quantized signal is obtained by the subtractor 32 and the obtained difference is integrated by the integrator 34. This allows increasing the signal-to-noise ratio (SNR) in the target signal band with a bit-reduced quantization. The use of the bit-reduced quantization facilitates a high-speed operation, that is, an operation at a high sampling frequency. This allows simplifying the configuration of the anti-aliasing filter and reducing the circuit size. When such a stable power supply that high frequency components in the frequency range higher than fs/2 (the half of the sampling frequency fs) are sufficiently removed is used, the anti-aliasing filter may be removed. The signal obtained by the bit-reduced quantization contains large high-frequency noise components; however, the high-frequency noise components can be removed by the digital filter. This implies the configuration of this embodiment can suppress an undesired increase in the circuit size compared to a case when the output voltage of the D-class amplifier is fed back through an analog filter. The use of a recent micro-patterning process further suppresses the increase in the circuit size.

Also, the use of the PWM gain control circuit effectively reduces the output error resulting from variations in the power supply voltage for both cases when the input signal of the D-class amplifier is an analog signal and when a digital signal. Furthermore, the error integration section can be realized with a reduced circuit size compared to the high-performance A-D converter used in the above-mentioned prior art, since the error integration section, which incorporates the subtractor, the integrator and the quantizer, is simple in the circuit configuration.

Second Embodiment

Figure 10:
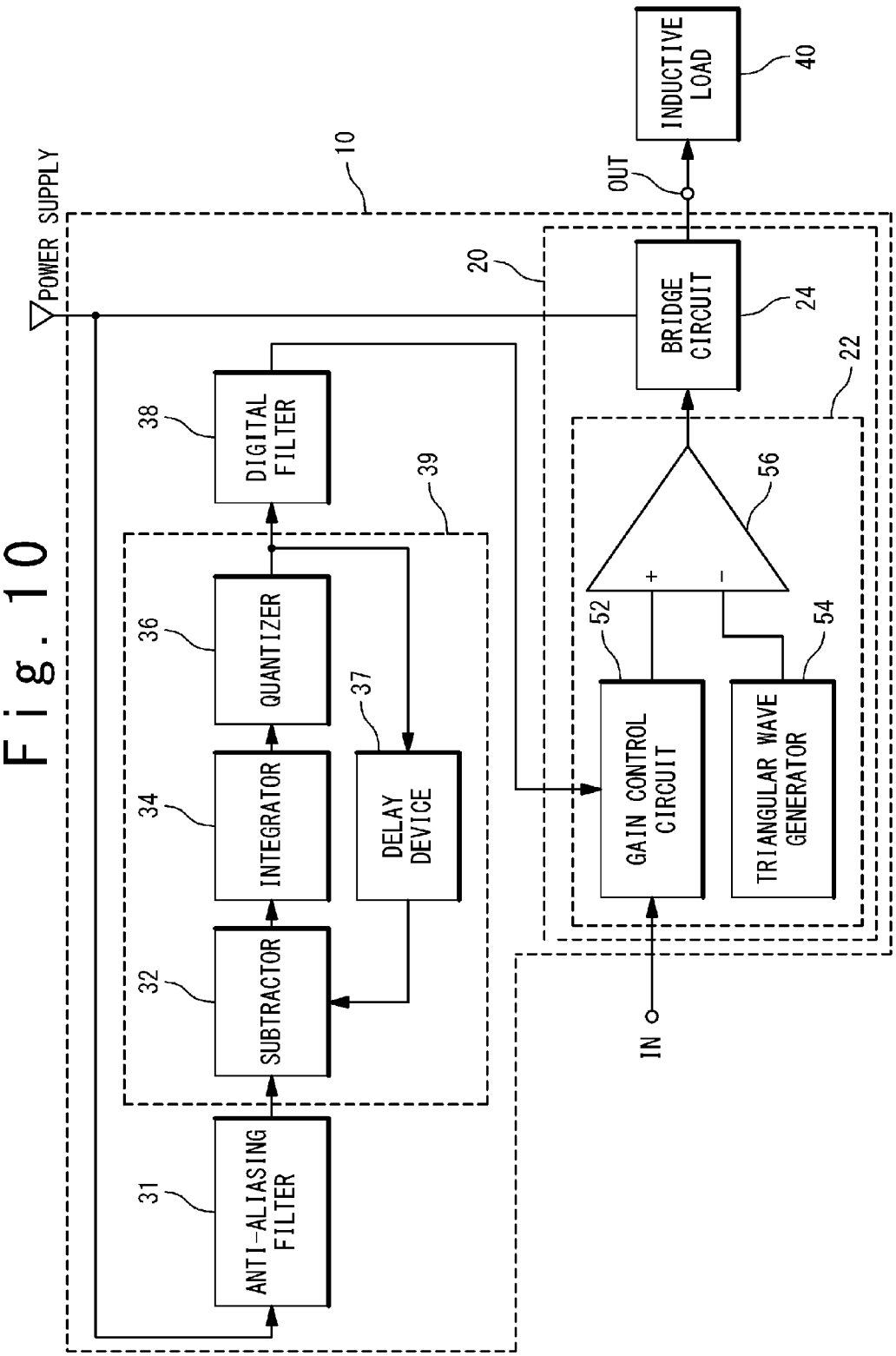
FIG. 10 is a diagram showing an exemplary configuration of a D-class amplifier according to a second embodiment of the present invention.

FIG. 10 is a block diagram showing an exemplary configuration of a D-class amplifier according to a second embodiment of the present invention. The D-class amplifier 10 includes an anti-aliasing filter 31, an error integration section 39, a digital filter 38, a gain control circuit 52, a triangular wave generator 54, a comparator 56 and a bridge circuit 24. The error integration section 39 includes a subtractor 32, an integrator 34, a quantizer 36, and a delay device 37. The anti-aliasing filter 31, the error integration section 39 and the digital filter 38 correspond to the power supply voltage detection section 30 of the first embodiment. The gain control circuit 52, the triangular generator 54 and the comparator 56 correspond to the gain-controlled PWM circuit 22. The bridge circuit 24 includes a half bridge circuit or an H bridge circuit.

The anti-aliasing filter 31 is fed with the power supply voltage which is fed to the bridge circuit 24. The anti-aliasing filter 31 removes high-frequency noise superposed on the power supply voltage, and feeds the noise-removed power supply voltage to the error integration section 39. The error integration section 39 generates a detection voltage by bit-reduced quantization of the power supply voltage and feeds the detection voltage to the digital filter 38. The digital filter 38 removes the quantization error from the output signal of the error integration section 39 (that is, the detection voltage) and feeds the resultant signal to the gain control circuit 52. The gain control circuit 52 amplifies the input signal IN in response to the signal generated by the digital filter 38, and feeds the amplified input signal to the comparator 56. The comparator 56 compares the triangular wave signal received from the triangular wave generator 54 and the amplified input signal received from the gain control circuit 52 to generate a PWM signal. The generated PWM signal is subjected to power amplification by the bridge circuit 24 and the resultant signal is fed to the inductive load 40.

Figure 11:
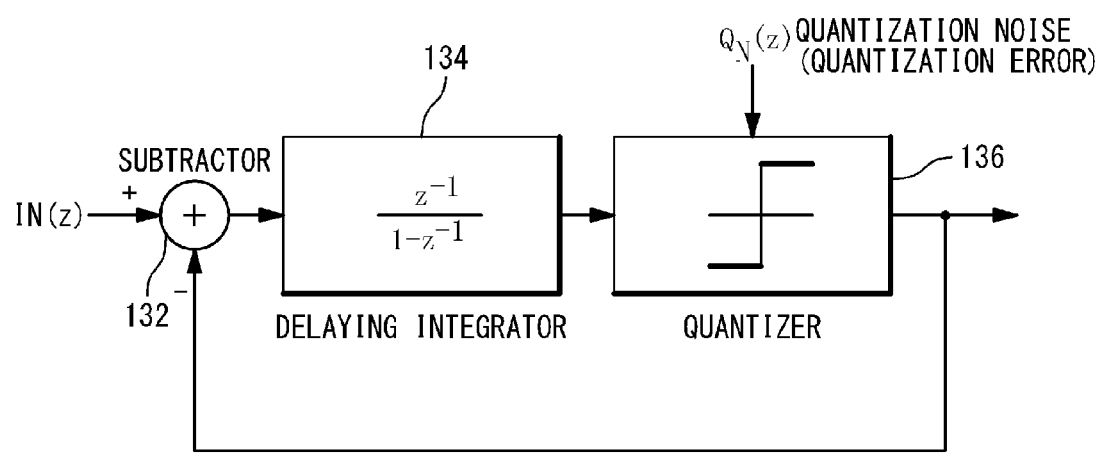
FIG. 11 is a block diagram showing an exemplary operation of an error integration section of the D-class amplifier according to the second embodiment.

The operation of the error integration section 39 is expressed by a block diagram shown in FIG. 11. The operation of the error integration section 39 is expressed by a subtractor block 132, a delaying integrator block 134, and a quantizer block 136. The functions of the integrator 34 and the delay device 37 in FIG. 10 are collectively expressed by the delaying integrator block 134. It should be noted that the delaying function of the block 134, which is positioned between the output of the subtractor block 132 and the input of the quantizer block 136, is equivalent to that of the delay device 37, which is positioned between the output of the quantizer 36 and the input of the subtractor 32 as shown in FIG. 10. The operation of the block diagram shown in FIG. 11 is expressed by the following expression:

$$\mathrm{OUT}(z) = \frac{z^{-1}}{1-z^{-1}}[\mathrm{IN}(z) - \mathrm{OUT}(z)] + Q_N(z), \quad (1)$$

where $Q_N(z)$ is the quantization noise.

The following expression is obtained by deformation of expression (1):

$$\mathrm{OUT}(z) = \mathrm{IN}(z) \cdot z^{-1} + (1-z^{-1}) \cdot Q_N(z).$$

This expression means that the transfer function against the quantization noise $Q_N$ is $(1-z^{-1})$. This transfer function has derivative characteristics, and therefore the quantization noise at low frequencies is converted to that in high frequency range.

In an actual implementation, the subtractor, the integrator and the delay device may be collectively integrated as a switched-capacitor integration circuit. FIG. 12 shows a circuit diagram showing an exemplary configuration of the switched-capacitor integration circuit used in the error integration section 39. The switched-capacitor integration circuit includes switches 141 to 144, 151 to 154, capacitors C11, C12, C21, C22, voltage switching circuits 148, 158, a differential amplifier 138 and a comparator 139. The voltage switching circuit 148 and 158 provides selection between a positive reference voltage VREFP and a negative reference voltage VREFM in response to the output voltage, and feeds selected one to the switches 142 and 152, respectively. The switch 143 is connected between a common voltage source feeding a common voltage VCM and the connection node between the capacitor C11 and the switch 144, and the switch 153 is connected between the common voltage source feeding the common voltage VCM and the connection node between the capacitor C12 and the switch 154. The circuit configuration shown in FIG. 11 is efficient in the circuit size compared to a case when the subtractor, the integrator and the delay device are individually integrated.

Figure 13A:
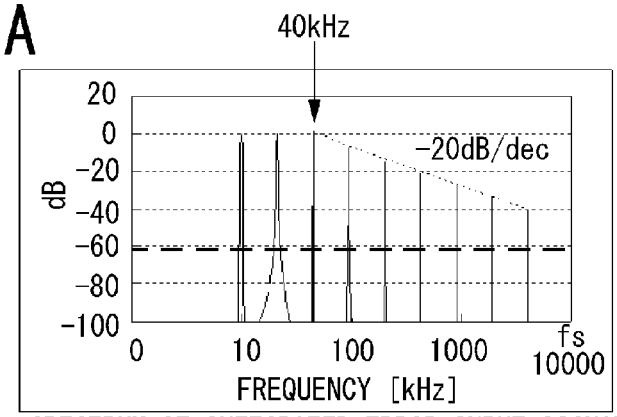
FIGS. 13A and 13B are diagrams showing the spectrums of the input and output signals of the error integration section.
Figure 13B:
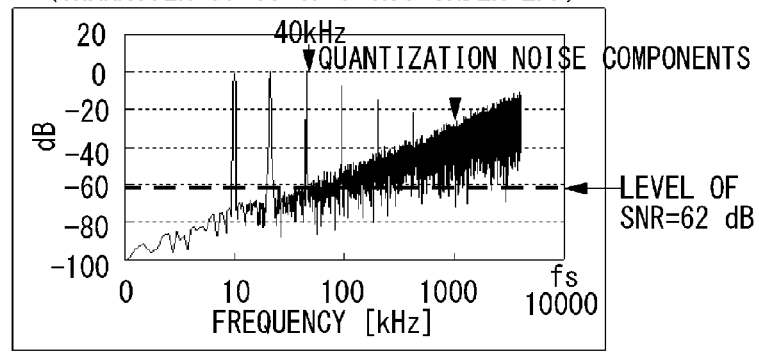

Also, the operation shown in FIG. 11 makes it easy to set the sampling frequency fs to a high frequency, since it can be achieved easily by using a switched capacitor integration circuit and a comparator. When an oversampling technique is used (that is, when the sampling frequency fs is set to a frequency sufficiently higher than the target signal band), the low-frequency quantization noise is further reduced. Here, let us assume that the target signal band is in a range below 40 kHz and the sampling frequency fs is 8.2 MHz. When the output signal outputted from an anti-aliasing filter (−20 dB/dec) is fed to the thus-configured error integration section 39, as shown in FIGS. 13A and 13B, a signal-to-noise ratio (SNR) of 62 dB, which corresponds to 10-bit resolution, can be achieved in a frequency region lower than 40 kHz.

Figure 14:
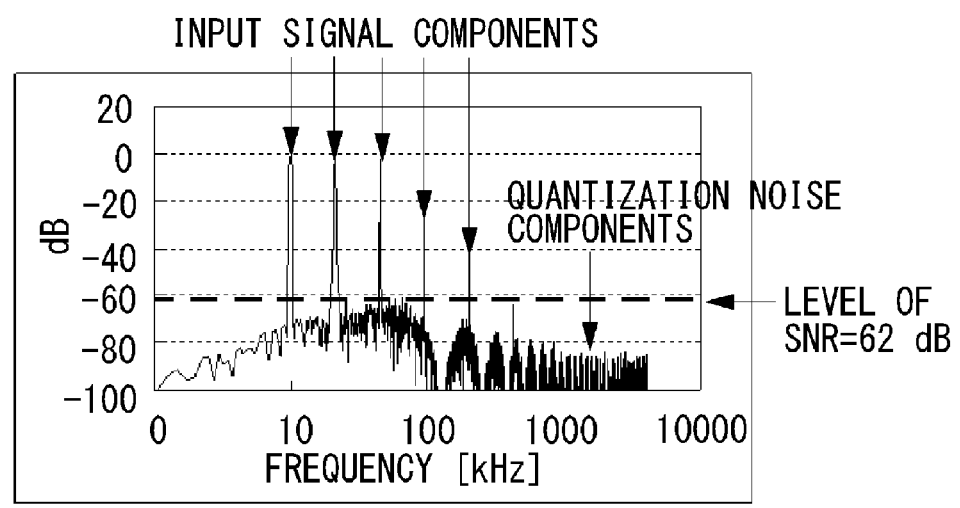
FIG. 14 is a diagram showing the spectrum of the output signal of a digital filter.

A multi-bit signal with a sufficient resolution is obtained in the target signal band by filtering out the quantization error in the high frequency range, which is generated by the conversion by the error integration section 39. As one example, shown in FIG. 14 is the spectrum of the output signal of the digital filter 38 for a case when the output signal of the error integration section 39 is fed to the digital filter 38 with characteristics expressed by the following expression (2):

$$H(z) = \frac{1}{64^2}\left(\frac{1-z^{-64}}{1-z^{-1}}\right)^2. \quad (2)$$

The digital filter 38 thus configured can be realized with only 1000 or less gates, and therefore the use of the digital filter 38 only causes little influence on the chip size. When a finer design rule is employed, the influence on the chip size is further suppressed. Although a second-order moving average filter is presented as an example of the transfer function H(z) of the digital filter 38, a filter of different characteristics may be used as the digital filter 38. Differently from analog filters, digital filters can be easily configured to achieve steep filtering characteristics by increasing the order of the filters.

In response to the signal generated by the digital filter 38, which corresponds to the power supply voltage of the bridge circuit 24, the high duration period of the PWM signal is increased when the power supply voltage is reduced and the high duration period of the PWM signal is decreased when the power supply voltage is increased. Here, the gain control circuit 52 is a block providing an operation expressed by the following expression (3):

$$V_{OAMP} = \frac{PWR_{REF}}{PWR_{SENSE}} V_{IN}, \quad (3)$$

where $PWR_{REF}$ is a power supply voltage reference, $PWR_{SENSE}$ is the power supply voltage obtained through the digital filter 38, $V_{IN}$ is the input voltage of the D-class amplifier 10, and $V_{OAMP}$ is the output voltage of the gain control circuit 52.

Figure 15A:
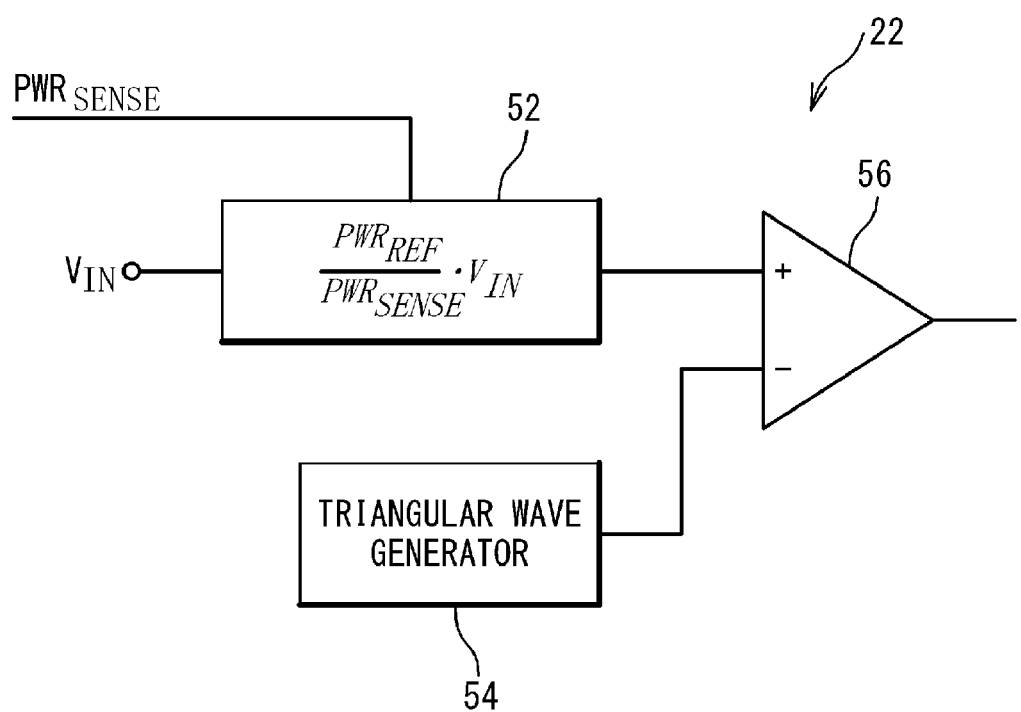
FIGS. 15A to 15C are diagrams showing exemplary configurations of gain-controlled PWM circuits.

The input voltage $V_{IN}$ may be a digital signal or an analog signal, depending on the configuration of the gain-controlled PWM circuit 22. FIG. 15A is a block diagram showing an exemplary configuration of the gain-controlled PWM circuit 22 for analog signal input.

It should be noted that it holds:

$$I_{load} \propto V_{DD} \cdot R_{duty}, \text{ and}$$

$$R_{duty} = V_{INPUT}/V_{tri},$$

where $I_{load}$ is the load current, $V_{DD}$ is the power supply voltage, $R_{duty}$ is the duty ratio of the PWM signal, $V_{INPUT}$ is the input voltage fed to the non-inverting input of the comparator 56, and $V_{tri}$ is the voltage level of the triangular wave signal. Accordingly, it holds:

$$I_{load} \propto V_{DD} \cdot V_{INPUT}/V_{tri} \quad (4)$$

For the configuration shown in FIG. 15A, $$V_{DD} = PWR_{SENSE},$$

$$V_{INPUT} = PWR_{REF}/PWR_{SENSE} \cdot V_{IN}, \text{ and}$$

$$V_{tri} = TRI_{REF},$$

where $TRI_{REF}$ is the amplitude reference of the triangular wave generator 54. By substituting these expressions into expression (4), the following expression is obtained:

$$I_{load} \propto PWR_{REF} \cdot V_{IN}/TRI_{REF}.$$

In this expression, no term is dependent on $PWR_{SENSE}$, which corresponds to the power supply voltage. This implies that the dependence of the load current on the power supply voltage is eliminated.

Figure 15B:
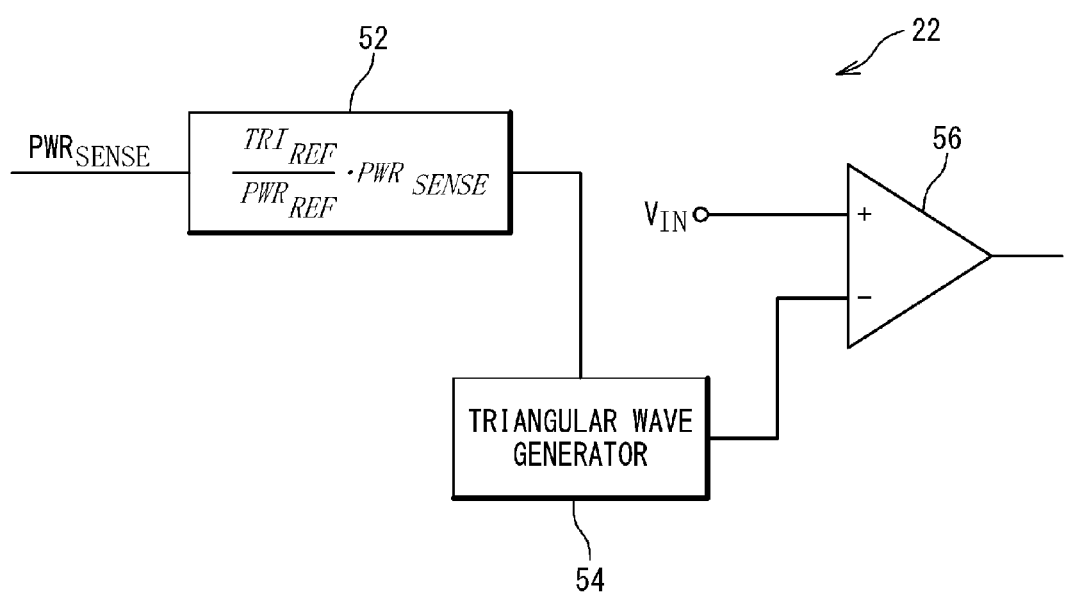

The same effect is obtained by performing an operation of $(TRI_{REF}/PWR_{REF}) \cdot PWR_{SENSE}$ and adjusting the amplitude of the triangular wave generator 54 accordingly. FIG. 15B shows an exemplary configuration of the gain-controlled PWM circuit 22 in this case.

For the configuration shown in FIG. 15B, it holds:

$$V_{DD} = PWR_{SENSE}, \text{ and}$$

$$V_{tri} = (TRI_{REF}/PWR_{REF}) \cdot PWR_{SENSE},$$

and therefore the following expression is obtained by substituting these expressions into expression (4):

$$I_{load} \propto PWR_{SENSE} \cdot V_{IN}/((TRI_{REF}/PWR_{REF}) \cdot PWR_{SENSE}).$$

As is the case of FIG. 15A, the following expression is obtained by deforming this expression:

$$I_{load} \propto PWR_{REF} \cdot V_{IN}/TRI_{REF}.$$

Figure 15C:
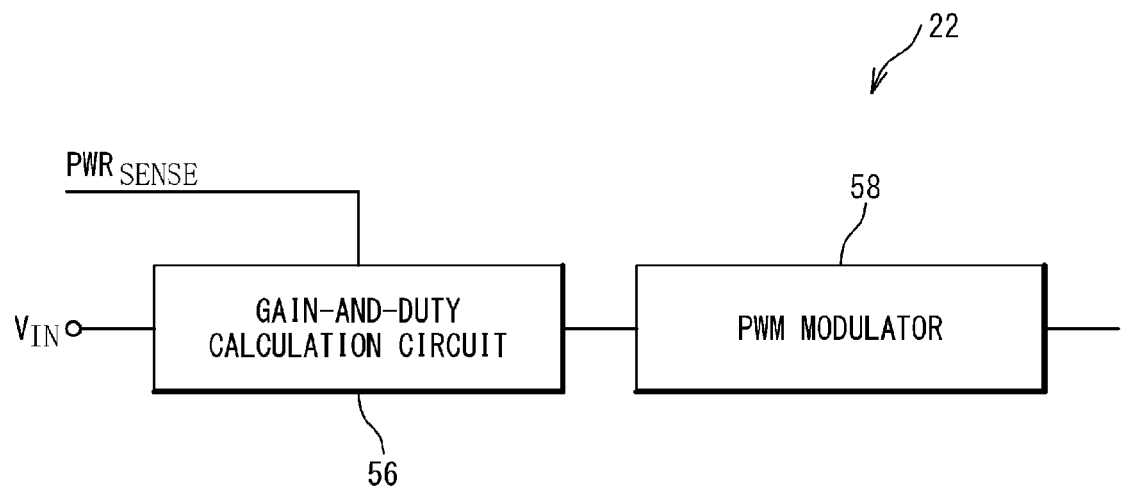

When the input signal of the D-class amplifier 10 is a digital signal, the PWM signal is generated by a gain-and-duty calculation circuit 56 and a PWM modulator 58, as shown in FIG. 15C. The gain-and-duty calculation circuit 56 calculates a desired gain from the sensed power supply voltage $PWR_{SENSE}$ and the product of the input voltage $V_{IN}$ and the calculated gain. The gain-and-duty calculation circuit 56 further calculates a duty ratio on the basis of the calculated product. The PWM modulator 58 generates the PWM signal in accordance with the duty ratio.

As thus described, the D-class amplifier 10 of this embodiment has a configuration suitable for circuit integration, allowing reducing the output error resulting from variations in the power supply voltage fed to the bridge circuit. In addition, requirements of the anti-aliasing filter are reduced, since the configuration of the D-class amplifier 10 of this embodiment makes it easy to increase the sampling frequency fs. This effectively reduces the total cost of the whole system.

In a general D-class amplifier, when an anti-aliasing filter is used in which the sampling frequency fs is 512 kHz, the signal band ranges below 40 kHz and an attenuation of 40 dB is required at the frequency of fs/2 (=256 kHz), as shown in FIGS. 16A and 16B, this requires the anti-aliasing filter to be configured as a filter of an order higher than two, resulting in an increase in the circuit size.

Figure 17A:
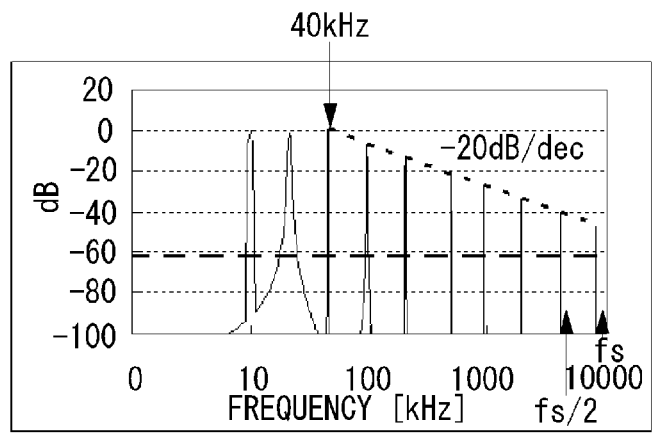
FIG. 17A is a graph showing the spectrum of the input signal of the error integration section for the case when the anti-aliasing filter connected to the input of the error integration section has first order LPF characteristics.
Figure 17B:
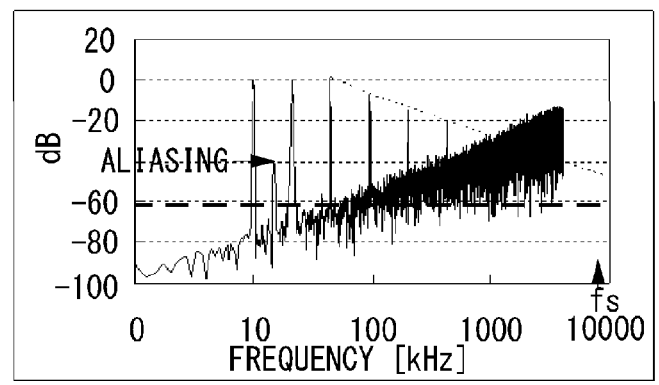
FIG. 17B is a graph showing the spectrum of a signal obtained by sampling the output signal of the error integration section at a sampling frequency of fs=8.2 MHz.

In this embodiment, on the other hand, the anti-aliasing filter is allowed to be configured as a first-order filter as shown in FIGS. 17A and 17B, when the anti-aliasing filter is configured so that the sampling frequency fs is 8.2 MHz, the signal band ranges below 40 kHz, and the attenuation of 40 dB is achieved at the frequency of fs/2 (=4.1 MHz). When an attenuation of 40 dB is achieved in a region higher than 4.1 MHz by the optimization of the power supply used for the D-class amplifier 10, this eliminates the need for providing the anti-aliasing filter. This implies that the required specifications of the power supply are reduced compared to the case when an attenuation of 40 dB is required in a frequency range above 256 kHz.

As thus described, the output error resulting from variations in the power supply voltage of the bridge circuit 24 can be reduced by providing the power supply voltage detection section 30, which includes a low-cost anti-aliasing filter, structure-simplified subtractor, integrator and quantizer, and a digital filter which enjoys an advantage of a micro-patterning technique.

Figure 18:
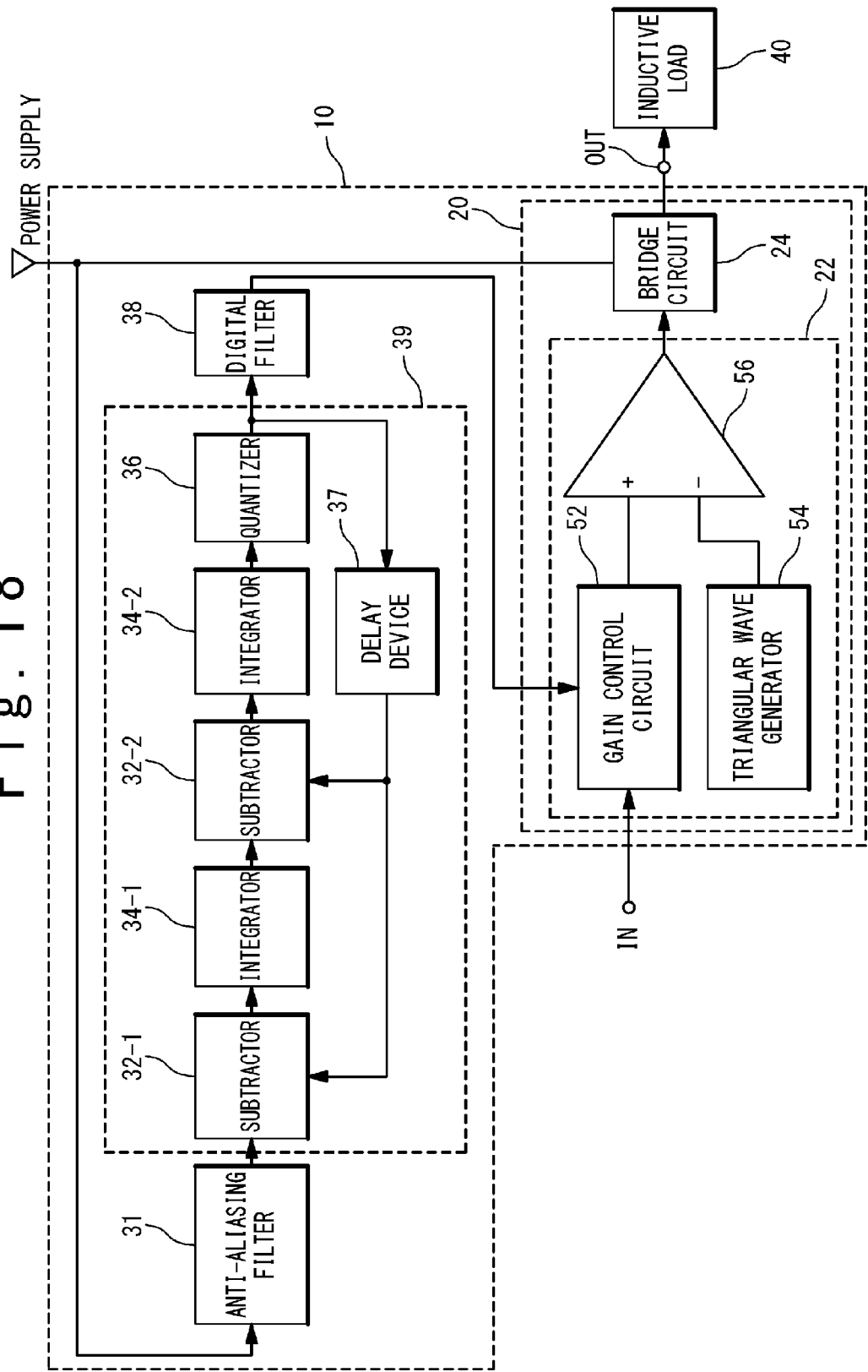
FIG. 18 is a diagram showing the configuration of a first modification of the D-class amplifier according to the second embodiment of the present invention.

As shown in FIG. 18, the error integration section 39 may include an increased number of subtractors and integrators. In FIG. 18, the error integration section 39 includes a subtractor 32-1, an integrator 34-1, a subtractor 32-2 and an integrator 34-2. Such configuration allows increasing the order of the transfer function against the quantization error. Accordingly, as shown in FIGS. 19A to 19C, the configuration shown in FIG. 18 can expand the signal band for the same sampling frequency used in the above-described circuit configuration.

Figure 20:
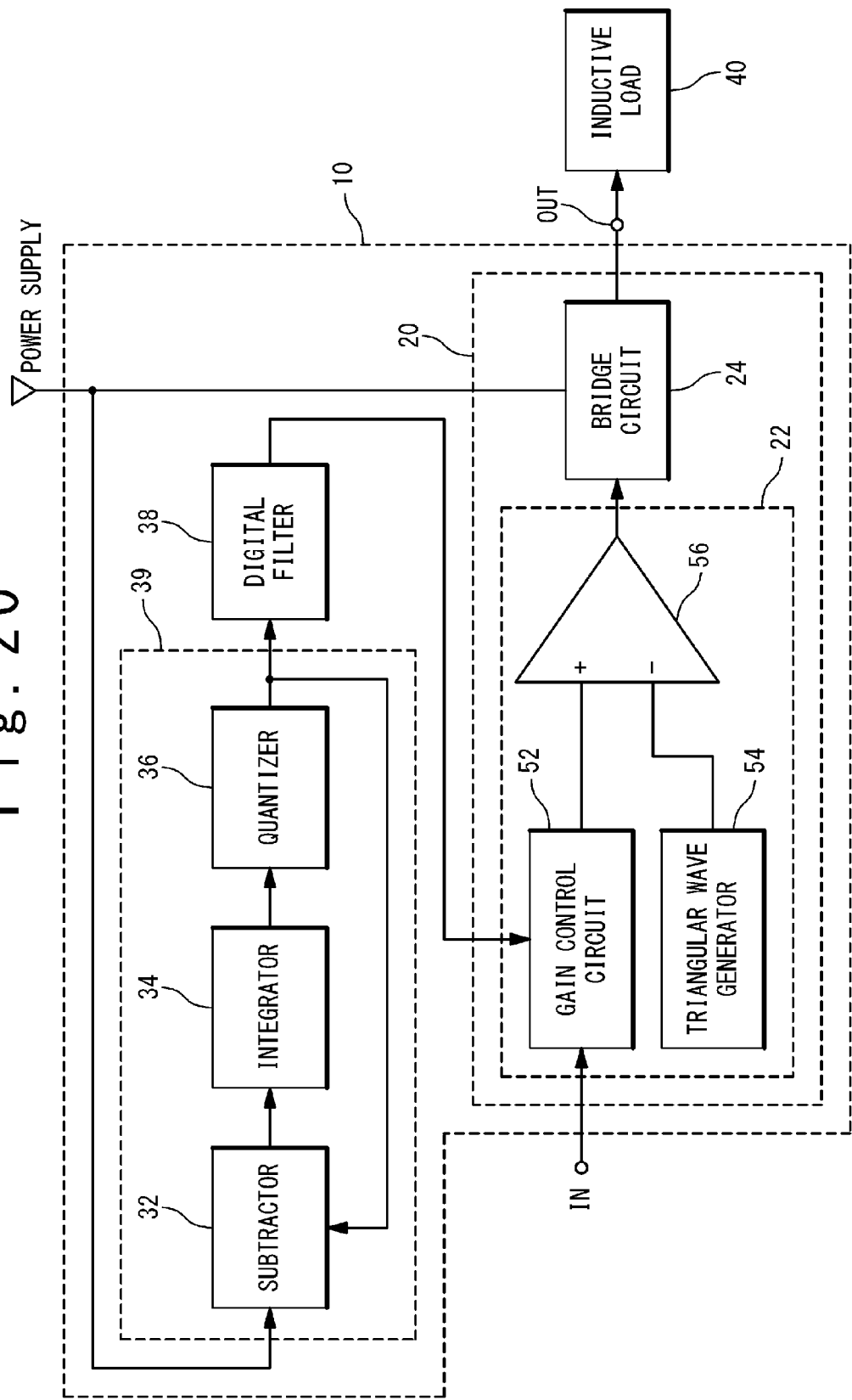
FIG. 20 is a diagram showing the configuration of a second modification of the D-class amplifier according to the present invention.
Figure 21:
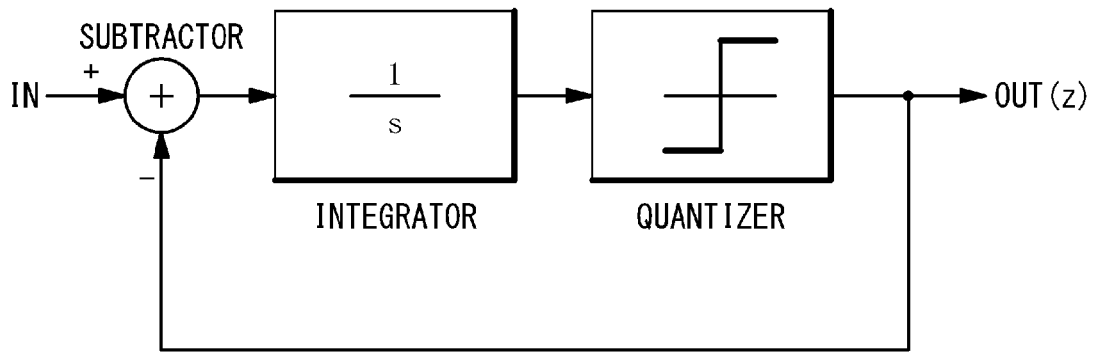
FIG. 21 is a block diagram showing an exemplary operation of an error integration section incorporated in the second modification.

The error integration circuit 39 may be configured to handle a continuous-time signal instead of a discrete-time signal. In this case, the error integration section 39 requires large-sized passive elements, such as resistors and capacitors, compared to the case when the error integration section 39 is configured to handle the discrete-time signal; however, the anti-aliasing filter can be removed as shown in FIG. 20, since an integrator adapted to a continuous-time signal has LPF-like characteristics. FIG. 21 is a block diagram showing an exemplary operation of the error integration section 39 in this case. For the case when the error integration section 39 handles the continuous-time signal, the operation of the error integration section 39 is expressed with a subtractor block, an integrator block and a quantizer block, excluding an delaying block.

Third Embodiment

Figure 22:
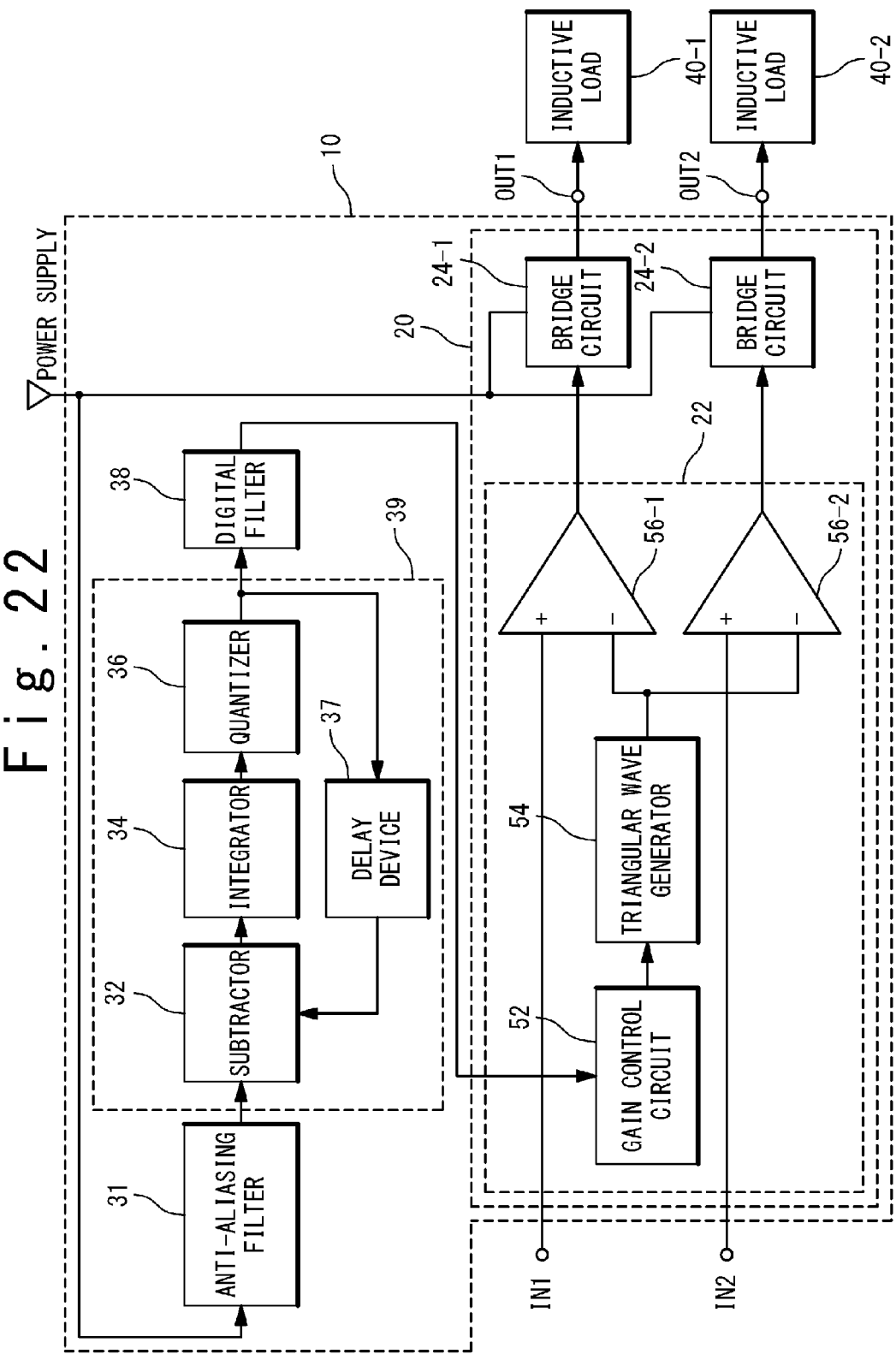
FIG. 22 is a diagram showing an exemplary configuration of a D-class amplifier according to a third embodiment of the present invention.

FIG. 22 is a block diagram showing an exemplary configuration of a D-class amplifier according to a third embodiment of the present invention. The amplifier section 20 includes comparators 56-1 and 56-2 which respectively compare input signals IN1 and IN2 with the triangular wave signal and thereby generate two PWM signals. The two generate PWM signals are subjected to power amplification by the bride circuits 24-1 and 24-2, respectively, and the output signals of the bridge circuits 24-1 and 24-2 are fed to inductive loads 40-1 and 40-2. In this embodiment, there are a plurality of bridge circuits fed with a common power supply voltage, and a common signal corresponding to the common power supply voltage is fed to the gain control circuit 52. This effectively reduces the circuit cost compared to the prior art in which output voltages are fed back.

Fourth Embodiment

Figure 23:
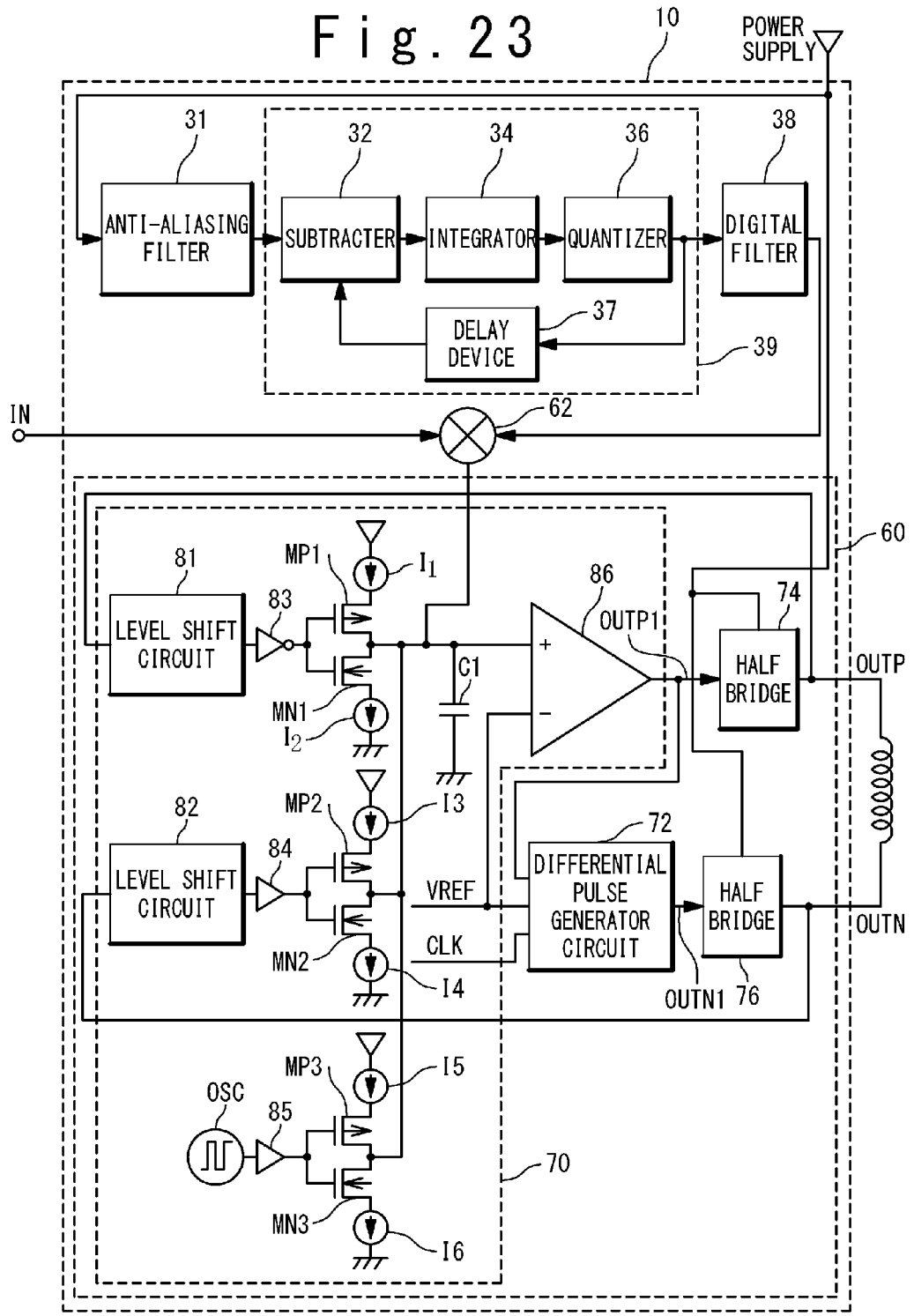
FIG. 23 is a diagram showing an exemplary configuration of a D-class amplifier according to a fourth embodiment of the present invention.

FIG. 23 shows a D-class amplifier 10 according to a fourth embodiment of the present invention, in which a multiplier 62 is additionally provided and the amplifier section 20 is replaced with an amplifier section 60 which is disclosed in Japanese Patent Application No. 2009-027540 A and the corresponding U.S. patent application publication No. 2009/0021305 A. The multiplier 62 has a first input receiving the input signal IN and a second input receiving the output signal of the digital filter 38. The output of the multiplier 62 is connected to the input of the amplifier section 60.

The amplifier section 60 includes a pulse generating circuit 70, a differential pulse generating circuit 72, and half bridge circuits 74 and 76. The pulse generating circuit 70 generates a first pulse-width modulated signal OUTP1 from the output signal of the multiplier 62, an inverted signal of an output signal OUTP which is generated by the half bridge circuit 74, and an output signal OUTN which is generated by the half bridge circuit 76. The differential pulse generating circuit 72 receives the first pulse-width modulated signal OUTP1 and generates a second pulse-width modulated signal OUTN1 by inverting the low level and the high level of the first pulse-width modulated signal OUTP1 and shifting the resulting pulse signal by a half period of the first pulse-width modulated signal OUTP1. The half bridge circuit 74 operates as a first pulse amplifier that receives the first pulse-width modulated signal OUTP1 and delivers the output signal OUTP to a first output terminal. The half bridge circuit 76 operates as a second pulse amplifier that receives the second pulse-width modulated signal OUTN1 to generate the output signal OUTN and delivers the output signal OUTN to a second output terminal.

In one embodiment, the pulse generating circuit 70 includes: level shift circuits 81, 82, an inverter 83, buffer circuits 84 and 85, PMOS transistors MP1 to MP3, NMOS transistors MN1 to MN3, current sources I1 to I6, a capacitor C1, and a comparator 86. The symbol OSC denotes a rectangular-shaped signal.

The amplifier section 60 is configured to feed back information of the duty ratio from the output terminal; the information fed back does not include the information of the voltage. Accordingly, the D-class amplifier 10 according to the fourth embodiment effectively reduces not only the output error resulting from variations in the power supply voltage.

In summary, the above-described D-class amplifiers according to the first to fourth embodiments of the present invention effectively reduce the output error resulting from variations in the power supply voltage. Also, the D-class amplifiers according to the first to fourth embodiments of the present invention eliminates the need for providing high-speed and large-sized A-D converters, allowing reduction of the circuit size. Furthermore, the D-class amplifiers according to the first to fourth embodiments of the present invention are suitable for circuit integration in terms of the circuit size, reducing the cost of the anti-aliasing filter. When a sufficiently stable power supply is used, the anti-aliasing filter may be removed from the D-class amplifier.

Although the present invention is described with reference to specific embodiments, the person skilled in the art would appreciate that the present invention is not limited to the above-described embodiments and the present invention may be implemented as a combination of two or more of the above-described embodiments as long as there is no contradiction. The configurations and details of D-class amplifiers according to the present invention may be implemented with various changes and modification understandable to the person skilled in the art.

What is claimed is:
1. A D-class amplifier, comprising:
a bridge circuit adapted to drive an inductive load;
a power supply voltage detection section outputting a quantized power supply voltage signal indicating a power supply voltage fed to said bridge circuit; and
a gain-controlled PWM section adjusting a gain in response to said quantized power supply voltage signal, amplifying said input signal in response to said gain, generating a PWM signal from said amplified input signal, and feeding said PWM signal to said bridge circuit,
wherein said power supply voltage detection section includes:
an error integration section generating a quantized signal by integrating a difference between said power supply voltage and said quantized power supply voltage signal; and a digital filter removing high frequency components of said quantized signal to output said quantized power supply voltage signal, and wherein said gain-controlled PWM section controls said gain such that variations of said power supply voltage are cancelled.

2. The D-class amplifier according to claim 1, wherein said error integration section includes:

a subtractor generating a difference signal indicating the difference between said power supply voltage and said quantized power supply voltage signal;

an integrator generating an integration signal by integrating said difference signal; and a quantizer quantizing said integration signal to generate said quantized signal.

3. The D-class amplifier according to claim 2, wherein said subtractor and said integrator are integrated as a switched-capacitor integration circuit.

4. The D-class amplifier according to claim 1, wherein said power supply voltage detection section further includes an anti-aliasing filter which restricts frequency components contained in said power supply voltage fed thereto.

5. The D-class amplifier according to claim 1, wherein said gain-controlled PWM section includes:

a gain control circuit amplifying said input signal with the gain controlled on said quantized power supply voltage signal to output an amplified signal;

a triangular wave generator generating a triangular wave signal; and a comparator comparing said amplified signal and said triangular signal to output said PWM signal.

6. The D-class amplifier according to claim 5, wherein said gain control circuit amplifies said input signal with a gain of $PWR_{REF}/PWR_{SENSE}$, where $PWR_{SENSE}$ is a signal level of said quantized power supply voltage signal, and $PWR_{REF}$ is a voltage reference of said power supply voltage.

7. The D-class amplifier according to claim 1, wherein said gain-controlled PWM section includes:

a triangular wave generator outputting a triangular wave signal;

an operation unit setting an amplitude of said triangular wave signal in response to said quantized power supply voltage signal; and a comparator comparing said input signal and said triangular wave signal to output said PWM signal.

8. The D-class amplifier according to claim 7, wherein said operation unit sets said amplitude of said triangular wave signal to $(PWR_{REF}/PWR_{SENSE}) \cdot TRI_{REF}$, where $PWR_{SENSE}$ is a signal level of said quantized power supply voltage signal, $PWR_{REF}$ is a voltage reference for said power supply voltage, and $TRI_{REF}$ is a amplitude reference of said triangular wave signal.

9. The D-class amplifier according to claim 5, wherein said input signal is an analog signal.

10. The D-class amplifier according to claim 6, wherein said input signal is an analog signal.

11. The D-class amplifier according to claim 7, wherein said input signal is an analog signal.

12. The D-class amplifier according to claim 8, wherein said input signal is an analog signal.

13. The D-class amplifier according to claim 7, further comprising:

another bridge circuit fed with said power supply voltage which is fed to said bridge circuit; and another comparator comparing another input signal with said triangular wave signal to output another PWM signal to said another bridge circuit.

14. The D-class amplifier according to claim 1, wherein said input signal is a digital signal, and wherein said gain-controlled PWM section includes:

an operation unit calculating said gain in response to said quantized power supply voltage signal and calculating a duty ratio in response to a product of said gain and said input signal; and a PWM modulator generating said PWM signal in response to said calculated duty ratio.

* * * * *